(12) United States Patent
Lee et al.

(10) Patent No.: US 6,392,496 B1
(45) Date of Patent: May 21, 2002

(54) DIGITAL PLL CIRCUIT HAVING A LOOK-UP TABLE AND METHOD THEREOF

(75) Inventors: Young-Dae Lee, Kyungki-do; Soo-Hyeon Sohn, Seoul, both of (KR)

(73) Assignee: LG Information & Communications, Ltd., Seoul (KR)

( * ) Notice: Subject to any disclaimer, the term of this patent is extended or adjusted under 35 U.S.C. 154(b) by 0 days.

(21) Appl. No.: 09/558,208

(22) Filed: Apr. 26, 2000

(30) Foreign Application Priority Data

Jun. 18, 1999 (KR) .............................. 99/22986

(51) Int. Cl.[7] .............................. H03L 7/085
(52) U.S. Cl. .............................. 331/17; 331/18; 331/25; 327/156
(58) Field of Search .............................. 331/1 A, 16, 17, 331/18, 25; 327/156–159

(56) References Cited

U.S. PATENT DOCUMENTS 5,036,294 A * 7/1991 McCaslin .................... 331/1 A
5,373,255 A * 12/1994 Bray et al. .................... 331/1 A
5,576,664 A * 11/1996 Herold et al. ................. 331/1 A

* cited by examiner

*Primary Examiner*—David Mis
(74) *Attorney, Agent, or Firm*—Fleshner & Kim, LLP

(57) ABSTRACT

A digital processing PLL circuit includes a phase difference computing unit for comparing a first clock signal inputted from.a reference clock generator and a second clock signal fedback from a VCO and computing a phase difference value during a calculation time unit; a control unit for controlling a manner that a phase difference correcting value corresponding to the phase difference value is read from a predetermined look-up table and the output clock signal of the VCO is synchronized with the first clock signal; and a memory unit for storing the look-up table. The value of the phase difference between the reference clock and the output clock for the calculation unit is computed with hardware by using an adder and a buffer. The CPU reads the corresponding phase difference compensation value directly from the look-up table and performs synchronous controlling. Therefore, a relatively cheaper CPU that is slower for processing compared to a CPU of the background art can be used to reduce costs, and increase processing speed a within the digital processing PLL to satisfy international standards. In addition, the present invention does not need a dual-port memory as required in the background art, and the length of the data of the phase detector is shortened, thereby reducing the size of the memory of the ROM.

20 Claims, 5 Drawing Sheets

DIGITAL PLL CIRCUIT HAVING A LOOK-UP TABLE AND METHOD THEREOF

BACKGROUND OF THE INVENTION

1. Field of the Invention

The present invention relates to a phase locked loop (PLL), and more particularly, to a digital PLL circuit operable at a high speed.

2. Background of the Related Art

Generally, a digital processing PLL (DP-PLL) adopted in a communication system is used for synchronizing a network synchronization clock and a system clock. Having a principle similar to a general analog PLL, it is widely called DP-PLL because it uses a digital processor for controlling the PLL.

FIG. 1 is a schematic block diagram of a general digital processing PLL in accordance with the background art. As shown in FIG. 1, the general digital processing PLL includes a phase-detector 1 for outputting a phase difference value between a reference clock (input CLK) inputted from a first terminal and a comparative clock (divided CLK) inputted after being fedback by a second terminal as a digital value. A dual-port memory 2 stores the phase difference value of a predetermined unit outputted from the phase detector 1. A central processing unit (CPU) 3 reads the data stored in the dual-port memory 2, block by block, and computes an average phase difference value. A digital to analog converter (DAC) 4 receives the average phase difference value from the CPU 3 and converts the difference value to a corresponding analog signal or voltage. A voltage controlled oscillator (VCO) 5 generates a predetermined output clock signal (VCO CLK) based on the voltage value inputted from the DAC 4. Finally, the general DP-PLL shown in FIG. 1 includes a divider 6 for dividing the output signal (VCO CLK) of the VCO 5 into a clock signal (divided CLK) of a predetermined frequency.

The operation of the general digital processing PLL in accordance with the background art will now be explained with reference to FIGS. 2A and 2B, which show waveforms of each clock signal of the DP-PLL shown in FIG. 1. In this example of the background art, a reference clock (input CLK) inputted to the phase detector 1 is 4 KHz, an output clock (VCO CLK) outputted from the VCO 5 is 25.92 MHz, and a comparative clock (divided CLK) divided by the divider 6 is 8 KHz.

As shown in FIG. 2A, the phase detector 1 counts the output clock VCO CLK (25.92 MHz) every 4 KHz (125 us) for the phase difference between the input CLK (4 KHz) and the divided CLK (8 KHz) and outputs the counted values $(X^N_S, X^N_{S+1} \ldots$ to the dual port memory 2. As shown in FIG. 2B, when the phase detector counts the counted values for one block cycle of k input clock cycles (k×125 us, for $X^N_1, \ldots X^N_k$ where k is a position integer), the CPU 3 reads the phase difference values corresponding to the block cycle, and computes an average value of the k phase difference values.

Subsequently, the average phase difference value computed by the CPU 3 is inputted to the DAC 4 and converted to a corresponding analog value. The analog value becomes a control voltage value for controlling the VCO 5, which generates a clock signal (VCO CLK) having a predetermined frequency (e.g., 25.92 MHz) based on the control voltage. The divider 6 divides the VCO CLK into a divided CLK signal of 8 KHz and outputs the divided CLK signal to the phase detector 1.

However, the digital processor PLL of the background art has a problem in that a considerable time delay occurs in order for the CPU 3 to read the data for one block cycle from the dual port memory 2 and average the data. Since computing several arithmetic operations requires excess system time, a desired operation can not be performed within a short period of time, such as a few ms, and thereby fails to meet the international standards (ITU-T G.813) limiting the control speed to a specified time.

SUMMARY OF THE INVENTION

An object of the invention is to solve at least the above problems and/or disadvantages and to provide at least the advantages described hereinafter.

Another object of the present invention is to provide a digital PLL circuit.

Another object of the present invention is to compute phase differences between an input reference clock signal and an output clock signal.

Another object of the present invention is to compute feedback from a VCO.

Another object of the present invention is to reduce an overloading of a communication system.

Another object of the present invention is to perform a signal processing at a high speed.

The present invention can be achieved, as a whole or in part, by a digital PLL circuit, including a phase difference computing circuit that compares a first clock signal and a second clock signal fedback from a voltage controlled oscillator (VCO), and computes a phase difference value for one the unit of at least one first clock signal cycle and at least one second clock signal cycle, a control unit for reading a phase difference correcting value corresponding to the phase difference value from a predetermined look-up table and synchronizing the output clock signal of the VCO with the first clock signal, and a memory unit for storing the look-up table.

The present invention can also be achieved, as a whole or in part, by a method for controlling a phasing of a digital PLL circuit, including comparing a first clock signal input from a reference clock generator and a second clock signal fedback from a voltage controlled oscillator (VCO computing a phase difference value between the first and second block signals for a time unit, reading a phase difference correcting value corresponding to the phase difference value, and synchronizing the second clock signal of the VCO with the first clock signal.

The present invention can also be achieved, as a whole or in part, by a digital PLL circuit, including a counter that receives a first clock signal inputted from a reference clock generator and a second clock signal fedback from a voltage controlled oscillator (VCO) and counting the number of cycles of the second clock signal from the time when the first clock signal and the second clock signal are synchronous as a counter value, a phase detector that detects the counter value of the second clock signal for every cycle of the first clock signal, an adder that adds the counter values output from the phase detector to compute a phase difference value for one time unit, a buffer that temporarily stores the added counter value while the adder adds the counter values output from the phase detector for a next time unit, a memory unit that stores a pre-computed phase difference correction value corresponding to the phase difference value in a look-up table, a central processing unit (CPU) that receives the stored added counter output from the buffer for one time unit and reads a corresponding phase difference correcting value from the memory unit, and a digital to analog converter (DAC) for outputting an analog voltage value for driving the VCO in accordance with the corresponding phase difference correcting value; wherein the VCO generates the second clock signal synchronized with the first clock signal according to the analog voltage value output from the DAC.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings which like reference numerals refer to like elements wherein.

DETAILED DESCRIPTION OF PREFERRED EMBODIMENTS

Figure 1:
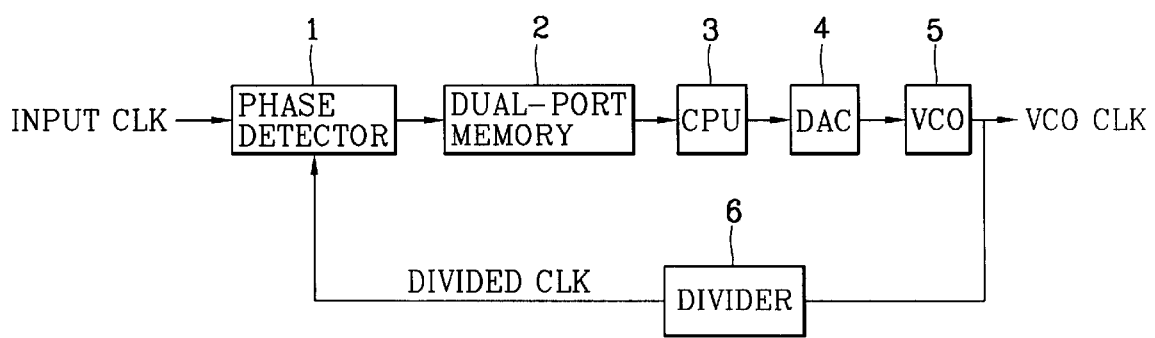
FIG. 1 is a schematic block diagram showing a general digital processing PLL in accordance with the background art.
Figure 2A:
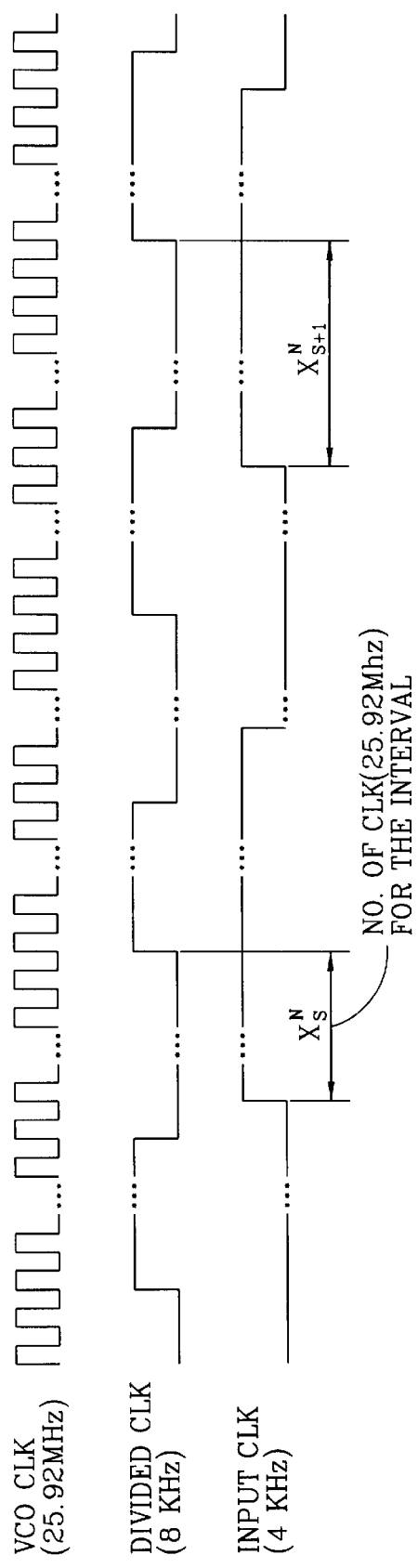
FIGS. 2A and 2B show exemplary waveforms of clock signals of the DP-PLL of FIG. 1 and a phase difference detection cycle of a phase detector in accordance with the background art.
Figure 2B:
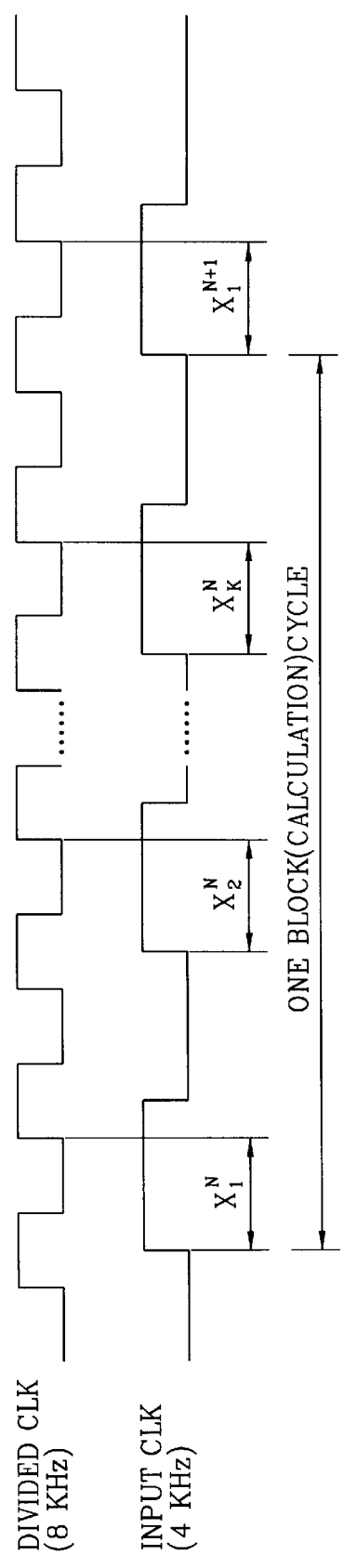
Figure 3:
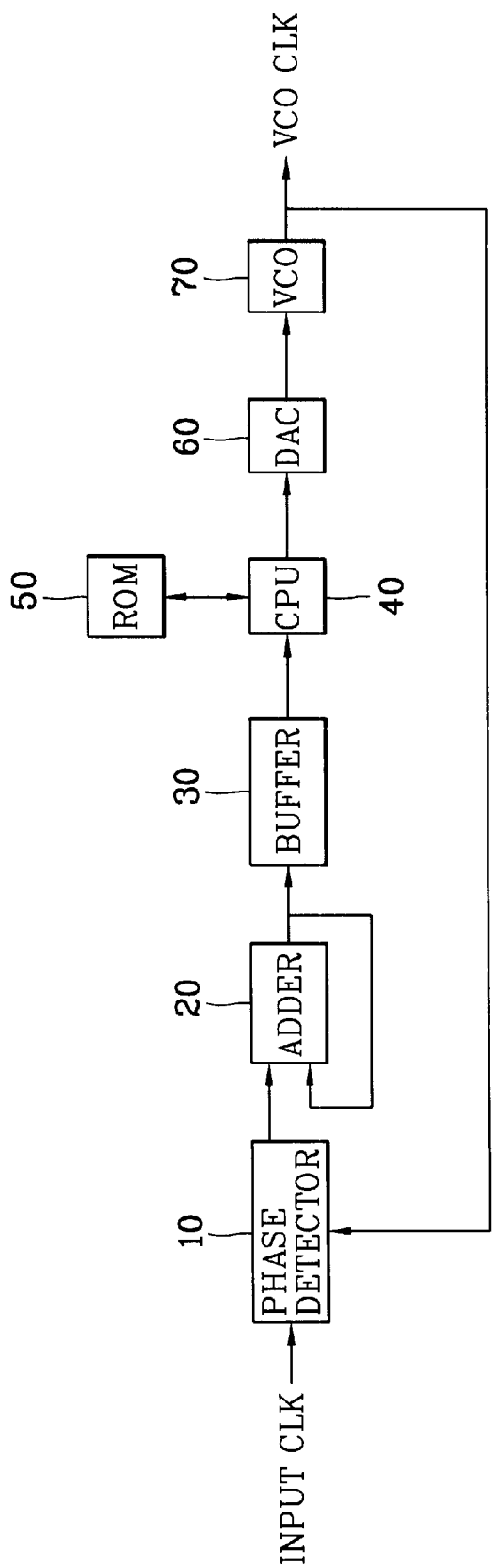
FIG. 3 is a schematic block diagram of a digital processing PLL in accordance with a preferred embodiment of the present invention.

FIG. 3 is a schematic block diagram of a digital processing PLL in accordance with a preferred embodiment of the present invention which includes a phase detector 10 for directly comparing an input reference clock (input CLK) and a VCO output clock (VCO CLK) fedback from a VCO 70, and for counting a VCO output clock number for the reference clock at every time interval of, for example, 125 μsec to output a phase difference value. An adder 20 repeatedly adds a predetermined number, such as sixteen, of the phase difference values outputted from the phase detector 10 at every time period of, for example, 125 μsec or 250 μsec. A buffer 30 temporarily stores the resulting values while adding is repeatedly performed by the adder 20.

As shown in FIG. 3, a ROM 50 stores a previously computed phase difference correction value for the addition result in a look-up table. A CPU 40 receives the addition result outputted from the buffer 30 at every predetermined period of, for example, 4 msec, and reads a corresponding phase difference correction value from the ROM 50 for adjusting to a phase difference. A DAC 60 outputs a control voltage value for driving the VCO 70 in accordance with an output of the CPU 40. The VCO 70 generates a predetermined output clock signal (VCO CLK) according to the control voltage value output from the DAC 60.

First, the phase detector 10 directly compares the reference clock signal (input CLK) of, for example, 4 Khz, inputted from a first terminal, and the output clock signal (VCO CLK) of, for example, 25.92 MHz, fedback from the VCO 70 at a second terminal. If the PLL is in a normal state, the reference clock signal (input CLK) and the VCO output clock signal (VCO CLK) should be synchronized to each other, and in the synchronized state, each cycle of the reference clock (input CLK) should have the same number of output clock (VCO CLK) cycles. That is, one cycle of the output clock (VCO CLK) of, for example, 25.92 MHz should always have 6480 cycles of the reference clock (input CLK) of, for example, 4 KHz.

Figure 4A:
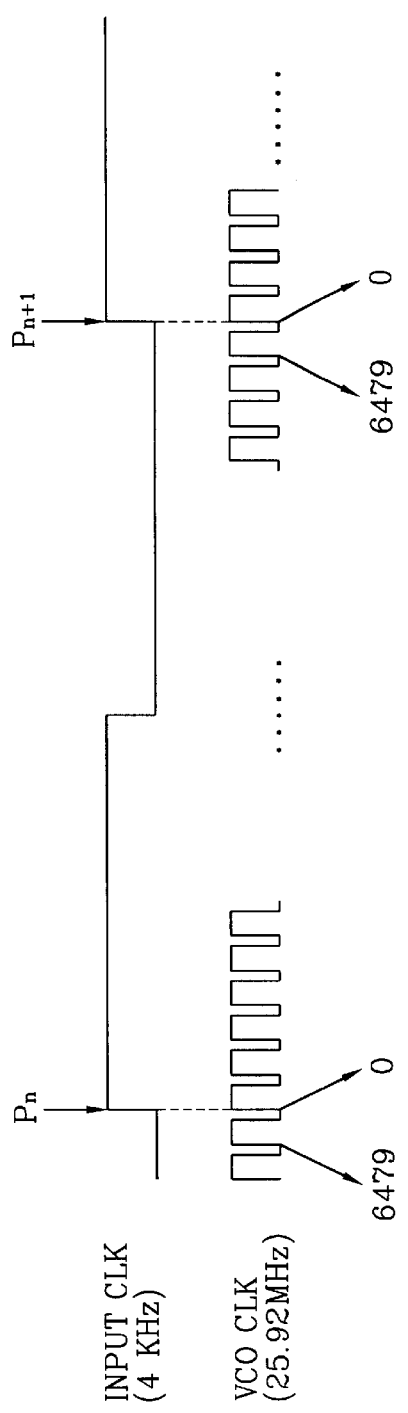
FIGS. 4A and 4B show exemplary waveforms comparatively showing a reference clock and an output clock of the DP-PLL of FIG. 3.

As shown in FIG. 4A, when the reference clock (input CLK) and the output clock (VCO CLK) are synchronized, then if the output clock value at the rising instant ($P_n$) prior to the reference clock is '0', the output clock value would also be '0' at the next rising instant ($P_{n+1}$).

Meanwhile, if the output clock (VCO CLK) is faster than the reference clock (input CLK), then the value at the next rising instant ($P_{n+1}$) would be greater than '0' (i.e., 1, 2, 3, . . . ), while, if the output clock is slower than the reference clock, the value would be 6479, 6478, 6477, etc. This principle may similarly be applied to divisors of 6480 (i.e., 2, 4, 6, . . . , 162, . . . 3240).

Figure 4B:
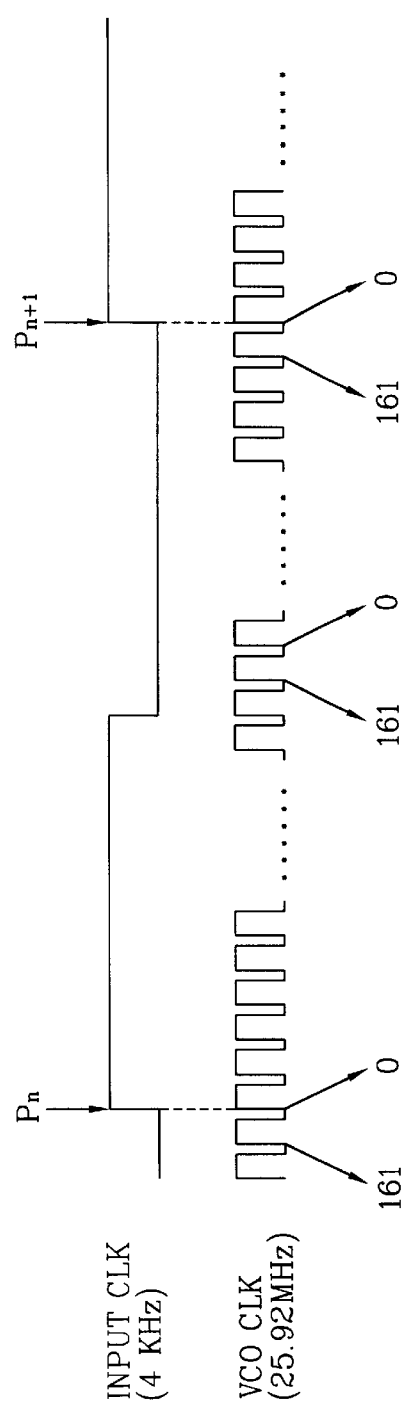

For example, as shown in FIG. 4B, where 162 is selected among divisors of 6480, if a clock value at a rising instant ($P_n$) prior to the reference clock signal (input CLK) is '0', then after the values of 0 to 161 are repeated 40 times, the output clock value of the next rising instant ($P_{n+1}$) would be also '0'. Likewise, if the output clock (VCO CLK) is faster than the reference clock (input CLK), the value at the next rising instant ($P_{n+1}$) would be greater than '0' (i.e., 1, 2, 3,. . . ), while, if the output clock is slower than the reference clock, the value would be 161, 160, 159, etc.

As described above, the phase detector 10 of the preferred embodiment of the present invention uses a counter corresponding to the divisor of the number of cycles of the output clock (VCO CLK) in one cycle of the reference clock (input CLK). In this respect, before the reference clock and the output clock are synchronized, there is a restriction for selecting the divisor because the output clock normally jitters in comparison to the reference clock. The range in which the output clock jitters should not go beyond a predetermined divisor value. If the selected divisor is too small, it would hardly cover the range. Meanwhile, if the selected divisor is too large, the data of the phase difference value is lengthened. Thus, it is desirable to select the smallest divisor that is able to absorb the jittering.

In this example of the preferred embodiment of the present invention, since the divisor value is set as 162, which can be expressed by 8 bit data, a simpler circuit can be implemented.

Additionally, the phase detector 10 may be designed by dividing the output clock values into negative and positive numbers. For example, if a counter processing −80 to +81 is desired instead of the counter of 0 to 159, then '0' indicates a normal state, a negative number indicates a state where the output clock is slower than the reference clock, and a positive number indicates a state where the output clock is faster than the reference clock. Moreover, when the counter is designed to include negative and positive numbers, the data amount may be reduced by half in comparison to a counter that only includes position numbers for generating a look-up table, and the capacity of the ROM 50 can be advantageously reduced accordingly.

The phase detector 10 counts the output clock (VCO CLK) of 25.92 MHz for the 4 KHz reference clock (input CLK) at every predetermined time, e.g., every 250 μsec interval, and outputs phase difference values. Then, the adder 20 adds up the phase difference values inputted from the phase detector 10 at every predetermined time, such as 250 μsec, and the buffer 30 stores the addition result. These steps are repeatedly performed for a predetermined number of times corresponding to one block (calculation) cycle, e.g., for 16 times. Accordingly, the addition result is outputted to the CPU 40 at every 4 msec (250 μsec×16=4 msec) for performing an interrupt service routine as programmed in the CPU 40.

During the interrupt service routine, the CPU 40 outputs a control signal for controlling the DAC 60 and the VCO 70 based on a look-up table pre-stored in the ROM 50 to adjust for a phase difference that even goes beyond the range of the look-up table. The pre-stored look-up table includes phase difference compensation values according to the sum (or an average value) of phase differences of each block (calculation) cycle.

The DAC 60 outputs a voltage value for driving the VCO 70 according to the control signal applied from the CPU 40. Based on the voltage value, the VCO 70 outputs the synchronized output clock signal (VCO CLK) of 25.92 MHz.

Figure 5A:
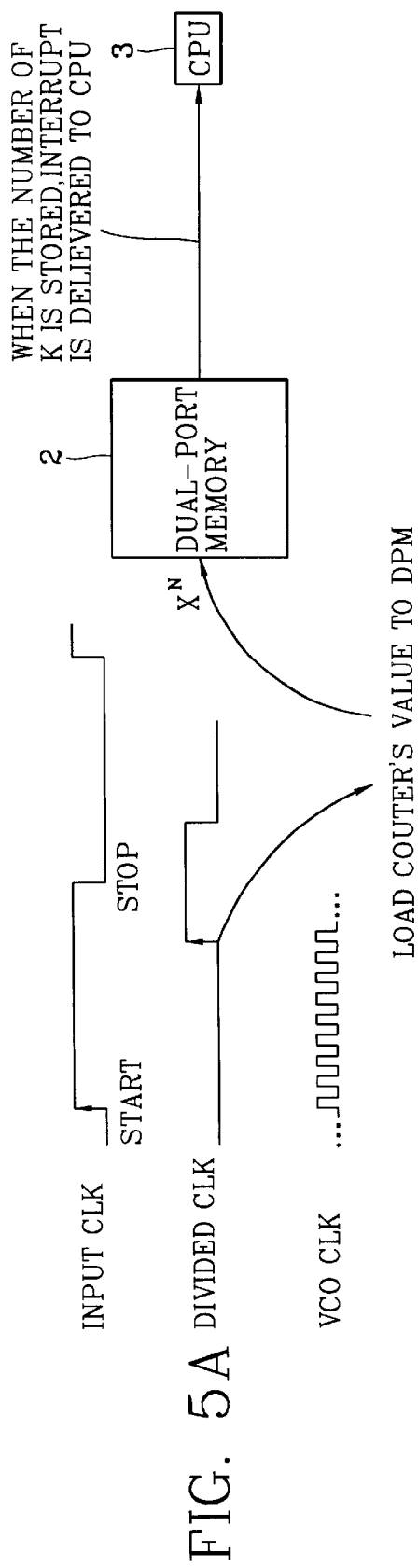
FIGS. 5A and 5B comparatively show digital processing PLL circuits of the background art and of a preferred embodiment of the present invention.
Figure 5B:
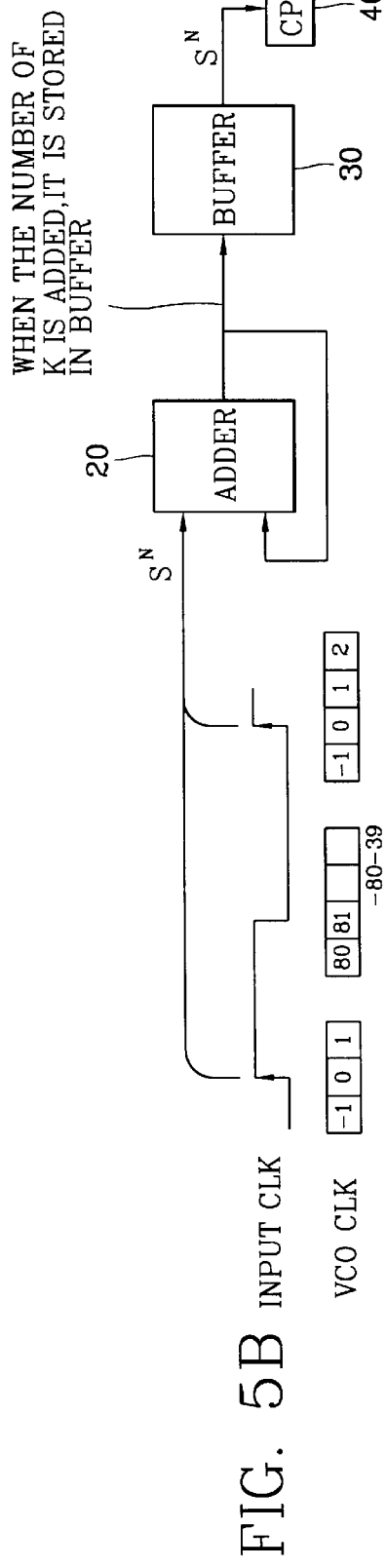

FIG. 5A illustrates the digital processing PLL circuit in accordance with the background art and FIG. 5B illustrates a process of the digital processing PLL circuit in accordance with the preferred embodiment of the present invention. As shown in FIG. 5A, in the background digital processing PLL circuit, the input reference clock (input CLK) and the comparative clock (divided CLK), generated by dividing the output clock (VCO CLK) fedback from the VCO 5, are counted based on of the output clock (VCO CLK) at every predetermined time, and stored in the dual-port memory 2 for one block cycle. The values are read by the CPU 3 to compute an average phase difference value, and the DAC 4 and the VCO 5 are controlled by the average phase difference value.

Comparatively, as shown in FIG. 5B, in the digital processing PLL circuit of the preferred embodiment of the present invention, after the number of VCO output clocks (VCO CLK) for the reference clock signal. (input CLK) is counted, its value is incremented by one block unit in the adder 20. The CPU 40 reads the resulting value and a corresponding compensation value from the look-up table, and the DAC 60 and the VCO 70 are controlled by the compensation value.

According to the digital PLL circuit of the preferred embodiment of the present invention, the value of the phase difference between the reference clock and the output clock for one block (calculation) cycle is computed with hardware by using the adder 20 and the buffer 30, and the CPU reads the corresponding phase difference compensation value directly from the look-up table and performs synchronous controlling operation. Therefore, a relatively less expensive CPU with a slower processing speed than the CPU 3 of the background art can be used to reduce costs, and provide faster processing speed to satisfy the international standard.

In addition, the present invention does not need the dual port memory 2, and the length of the data of the phase detector is shortened, thereby reducing the size of the memory of the ROM.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A digital phase locked loop circuit comprising:
    a phase difference computing circuit configured to compare a first clock signal to a second clock signal, wherein the second clock signal is supplied by a voltage controlled oscillator, and wherein the phase difference computing circuit outputs a phase difference value;
    a memory unit for storing a look-up table of a plurality of pre-calculated phase correction values, each corresponding to different phase difference values; and
    a control unit coupled to the phase difference computing circuit and configured to receive the phase difference values outputted from the phase difference computing circuit and read corresponding phase correction values from the look-up table to perform synchronization of the first and second clock signals.

2. The circuit of claim 1, wherein the phase difference computing circuit comprises:
    a counter for counting the number of cycles of the second clock signal from a time when the first clock signal and the second clock signal are synchronized as a counter value;
    a detector for detecting the counter value at a predetermined point of the first clock signal cycle;
    an adder for adding the detected count values for a predetermined number of times corresponding to a predetermined unit of time; and
    a buffer for temporarily storing the detected count values from the adder.

3. The circuit of claim 2, wherein the counter counts integers from 0 to N−1, where N is a divisor of the number of the second clock signal cycles during one cycle of the first clock signal.

4. The circuit of claim 3, wherein N is set at the smallest divisor to include a jittering.

5. The circuit of claim 2, wherein the counter counts integers from −N/2−1 to +N/2, where N is a divisor of the number of the second clock signal cycles during one cycle of the first clock signal.

6. The circuit of claim 5, wherein N is set at the smallest divisor to include a jittering region.

7. The circuit of claim 1, wherein the look-up table of phase correction values corresponding to phase difference values is derived from a control formula.

8. The circuit of claim 1, further comprising:
    a digital to analog converter coupled to the control unit and the voltage controlled oscillator, configured to output an analog voltage value corresponding to the phase correction value to the voltage controlled oscillator,
    wherein the voltage controlled oscillator outputs a clock signal of a predetermined frequency synchronized with the first clock signal according to the analog voltage value output from the digital to analog converter.

9. A method for synchronizing a first clock signal and a second clock signal, comprising:
    comparing a first clock signal input from a reference clock generator and a second clock signal from a voltage controlled oscillator;

computing a phase difference value between the first clock signal and the second clock signal over a predetermined unit of time;

reading a pre-calculated phase correction value corresponding to the thusly computed phase difference value from a look-up table stored in a memory; and synchronizing the second clock signal of the voltage controlled oscillator with the first clock signal in accordance with the phase correction value read from the look-up table.

10. The method of claim 9, wherein:

the comparing step includes:

counting the number of cycles of the second clock signal from the time when the first clock signal and the second clock signal are synchronous, as a counter value;

detecting the counter value for every cycle of the first clock signal; and the computing step includes adding the detected count values for the predetermined unit of time.

11. The method of claim 10, wherein, in the counting step, integers from 0 to N−1 are rotationally counted, where N is a divisor of the number of the second clock signal cycles during one cycle of the first clock signal.

12. The method of claim 11, wherein N is set at the smallest divisor to include a jittering region.

13. The method of claim 10, wherein, in the counting step, integers from −N/2−1 to +N/2 are counted rotationally, where N is a divisor of the number of the second clock signal cycles during one cycle of the first clock signal.

14. The method of claim 13, wherein N is set at the smallest divisor to include a jittering region.

15. The method of claim 9, wherein the look-up table of phase correction values corresponding to phase difference values is derived from a control formula.

16. A digital phase locked loop circuit comprising:

a counter configured to receive a first clock signal from a reference clock generator and a second clock signal from a voltage controlled oscillator, and further configured to count the number of cycles of the second clock signal from a time when the first clock signal and the second clock signal are synchronous, as a counter value;

a phase detector coupled to the counter, and configured to detect the counter value of the second clock signal for every cycle of the first clock signal;

an adder coupled to the counter, and configured to add the counter values output from the phase detector to compute a phase difference value for a predetermined unit of time;

a buffer coupled to the adder and configured to temporarily store the phase difference value;

a memory unit configured to store a look-up table of pre-computed phase correction values which corresponds to the phase difference values;

a central processing unit coupled to the buffer and configured to receive the phase difference values from the buffer unit and further configured to read a corresponding pre-computed phase difference correction value from the memory unit; and a digital to analog converter outputting an analog voltage value to the voltage controlled oscillator in accordance with the corresponding phase correction value read by the central processing unit; whereby the voltage controlled oscillator generates the second clock signal synchronized in phase with the first clock signal.

17. The circuit of claim 16, wherein the counter counts integers from 0 to N−1, where N is a divisor of the number of the second clock signal cycles during one cycle of the first clock signal.

18. The circuit of claim 17, wherein N is set to the smallest divisor to include a jittering region.

19. The circuit of claim 16, wherein the counter counts integers from −N/2−1 to +N/2, where N is a divisor of the number of the second clock signal cycles during one cycle of the first clock signal.

20. The circuit of claim 19, wherein N is set to the smallest divisor to include a jittering region.

* * * * *